US011799269B2

(12) United States Patent
Minamiru et al.

(10) Patent No.: US 11,799,269 B2
(45) Date of Patent: Oct. 24, 2023

(54) LIGHT EMITTING ELEMENT

(71) Applicant: FUJIFILM Business Innovation Corp., Tokyo (JP)

(72) Inventors: Takeshi Minamiru, Kanagawa (JP); Takashi Kondo, Kanagawa (JP); Takafumi Higuchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 331 days.

(21) Appl. No.: 17/147,425

(22) Filed: Jan. 12, 2021

(65) Prior Publication Data

US 2022/0077654 A1 Mar. 10, 2022

(30) Foreign Application Priority Data

Sep. 7, 2020 (JP) ................. 2020-150112

(51) Int. Cl.
| | |
|---|---|
| *H01S 5/183* | (2006.01) |
| *H01S 5/42* | (2006.01) |
| *H01S 5/042* | (2006.01) |
| *H01S 5/34* | (2006.01) |

(52) U.S. Cl.
CPC ...... *H01S 5/18311* (2013.01); *H01S 5/04256* (2019.08); *H01S 5/18361* (2013.01); *H01S 5/423* (2013.01); *H01S 5/18347* (2013.01); *H01S 5/34* (2013.01)

(58) Field of Classification Search
CPC ............. H01S 5/04254; H01S 5/04256; H01S 5/183–18397; H01S 5/423
See application file for complete search history.

(56) References Cited

U.S. PATENT DOCUMENTS

| | | | |
|---|---|---|---|
| 7,726,854 B2 | 6/2010 | Bourdin et al. | |
| 9,787,062 B2 | 10/2017 | Kondo et al. | |
| 2020/0280175 A1* | 9/2020 | Lee | H01S 5/18377 |

FOREIGN PATENT DOCUMENTS

| | | | |
|---|---|---|---|
| JP | 2007109654 | 4/2007 | |
| JP | 2017050463 | 3/2017 | |
| WO | WO-2020105411 A1 * | 5/2020 | H01S 5/0234 |

* cited by examiner

*Primary Examiner* — Minsun O Harvey
*Assistant Examiner* — Stephen Sutton Kotter
(74) *Attorney, Agent, or Firm* — JCIPRNET

(57) ABSTRACT

A light emitting element formed of a laminate having a current constriction layer includes: a semiconductor substrate; a light emitting portion having plural first recess portions having a depth reaching the current constriction layer, and a current constriction structure formed in the current constriction layer and having an oxidized region where the current constriction layer is oxidized and a non-oxidized region surrounded by the oxidized region; an electrode pad disposed between the light emitting portion and an outer edge portion of the semiconductor substrate; and a step portion disposed between the electrode pad and the light emitting portion and formed from an upper surface of the laminate to the current constriction layer, and the current constriction layer in a region surrounded by the step portion is the oxidized region except for the non-oxidized region.

12 Claims, 6 Drawing Sheets

LIGHT EMITTING ELEMENT

CROSS-REFERENCE TO RELATED APPLICATIONS

This application is based on and claims priority under 35 USC 119 from Japanese Patent Application No. 2020-150112 filed Sep. 7, 2020.

BACKGROUND

(i) Technical Field

The present invention relates to a light emitting element.

(ii) Related Art

JP2017-050463A discloses a surface emission semiconductor laser array including: a contact layer formed on a substrate; a plurality of mesa structures formed on the contact layer and including a first semiconductor multilayer film reflector of a first conductivity type, an active region on the first semiconductor multilayer film reflector, and a second semiconductor multilayer film reflector of a second conductivity type on the active region; a first metal layer formed to cover a region including the contact layer around the mesa structures and apart of which is a first conductivity type electrode pad; an insulating film formed on the first metal layer to cover a region excluding the upper surface of the mesa structures; and a second metal layer formed on the insulating film to cover a region including a part of the upper surface of the mesa structures, and a part of which is a second conductivity type electrode pad.

SUMMARY

Aspects of non-limiting embodiments of the present disclosure relate to a light emitting element that is capable of suppressing the generation of a leak current even in a case where a pad is provided between an outer edge portion of a chip and a light emitting region in the light emitting element in which a current constriction layer is formed through a trench.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting element formed of a laminate having a current constriction layer, including: a semiconductor substrate; a light emitting portion having a plurality of first recess portions having a depth reaching the current constriction layer, and a current constriction structure formed in the current constriction layer and having an oxidized region where the current constriction layer is oxidized and a non-oxidized region surrounded by the oxidized region; an electrode pad disposed between the light emitting portion and an outer edge portion of the semiconductor substrate; and a step portion disposed between the electrode pad and the light emitting portion and formed from an upper surface of the laminate to the current constriction layer, in which the current constriction layer in a region surrounded by the step portion is the oxidized region except for the non-oxidized region.

BRIEF DESCRIPTION OF THE DRAWINGS

Exemplary embodiment(s) of the present invention will be described in detail based on the following figures, wherein.

DETAILED DESCRIPTION

Hereinafter, exemplary embodiments of the present invention will be described in detail with reference to the drawings. In the following description, a form in which a light emitting element according to an exemplary embodiment of the present invention is applied to an optical element array having a plurality of light emitting portions will be illustrated and described, but a form in which the present invention is applied to a light emitting element having a single light emitting portion may also be adopted. In addition, in the following description, a form in which a vertical cavity surface emitting laser (VCSEL) is applied as the light emitting element according to the exemplary embodiment of the present invention will be illustrated and described. However, the present invention is not limited thereto, and a form in which the present invention is applied to a light emitting diode (LED) or the like may also be adopted.

First Exemplary Embodiment

Figure 1:
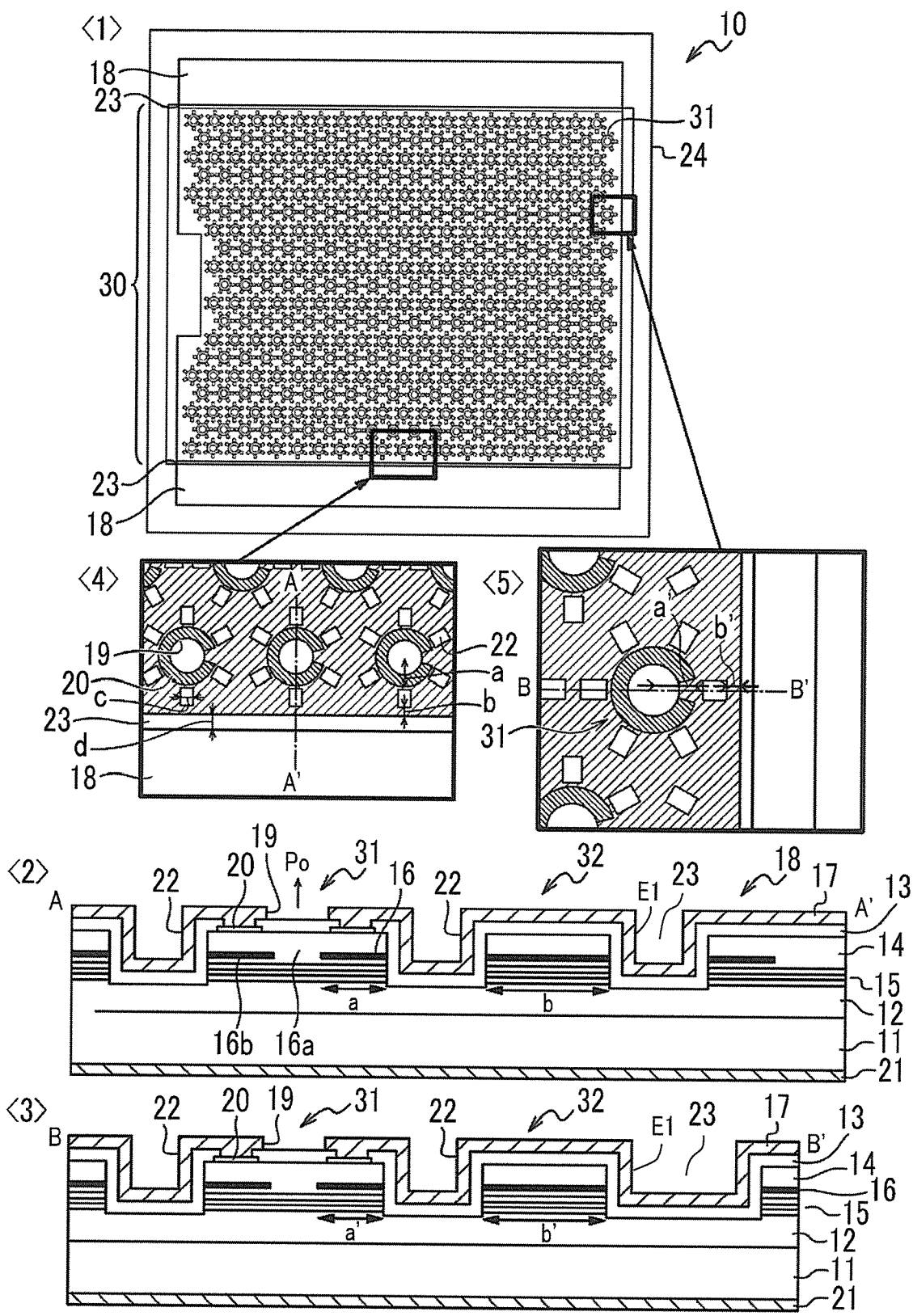
FIG. 1 shows plan views and cross-sectional views showing an example of a configuration of a light emitting element according to a first exemplary embodiment.

A light emitting element 10 according to this exemplary embodiment will be described with reference to FIGS. 1 to 5. A part <1> shown in FIG. 1 shows a plan view of the light emitting element 10, parts <4> and <5> show partially enlarged views, a part <2> shows a cross-sectional view taken along the line A-A' shown in the part <4>, and a part <3> shows a cross-sectional view taken along the line B-B' shown in the part <5>. Both the parts <4> and <5> of FIG. 1 are cross-sectional views taken along the straight lines A-A' and B-B' passing through trenches 22 to be described later, respectively. The reference numeral 24 represents an outer edge portion of the light emitting element 10 in a chip state.

As shown in the part <1> of FIG. 1, the light emitting element 10 includes a light emitting region 30, an anode pad 18, and a recess portion 23. The light emitting region 30 is a region in which a plurality of light emitting portions 31 are arranged. In this exemplary embodiment, a form in which the light emitting portions 31 are arranged in zigzag will be illustrated. However, the present invention is not limited thereto, and for example, the light emitting portions may be arranged in an array. The number of the light emitting portions 31 may be appropriately set in consideration of the output power required for the light emitting element 10. The anode pad 18 is a pad on the anode side formed in apart of the wiring extended from an anode electrode 20 of the light emitting portion 31. In this exemplary embodiment, a form in which two anode pads are provided at both ends of the light emitting element 10 will be illustrated and described. However, the present invention is not limited thereto, and a form in which an appropriate number of anode pads are provided in consideration of mounting of the light emitting element 10 and the like may be adopted. The recess portion 23 is a groove provided between the light emitting region 30 and the anode pad 18. The "anode pad 18" is an example of an "electrode pad" according to the exemplary embodiment of the present invention, and the "recess portion 23" is an example of a "second recess portion" according to the exemplary embodiment of the present invention.

As shown in the parts <2> and <3> of FIG. 1, the light emitting element 10 includes an N type substrate 11, a lower DBR 12 formed on the substrate 11, an active layer 15 formed on the lower DBR 12, an upper DBR 14 formed on the active layer 15, a current constriction layer 16 formed in a part of the upper DBR 14, an anode electrode 20 formed on the upper DBR 14, an interlayer insulating film 13 formed on the lower DBR 12 and the upper DBR 14, and an anode wiring 17 formed on the interlayer insulating film 13. A cathode electrode 21 (backside electrode) is formed on a back surface of the substrate 11, and the anode pad 18 is formed in a part of the anode wiring. The anode wiring 17 on an upper surface of the light emitting portion 31 is provided with a circular emission opening 19, and emitted light Po from the light emitting portion 31 is emitted through the emission opening 19. The anode wiring 17 is connected to the anode electrode 20 on the upper surface of the light emitting portion 31. The "cathode electrode 21" is an example of an "electrode" according to the exemplary embodiment of the present invention.

The lower DBR 12 is a multilayer film reflector configured by alternately and repeatedly laminating two $0.25\lambda/n$-thick semiconductor layers having different refractive indices where $\lambda$ is an oscillation wavelength of the light emitting element 10 and n is a refractive index of the medium (semiconductor layer). In this exemplary embodiment, the lower DBR 12 is an N type.

The active layer 15 is a portion that generates light to be emitted from the light emitting portion 31, and in this exemplary embodiment, for example, a multiple quantum well (MQW) structure in which a barrier layer and a quantum well layer are alternately arranged is provided.

The current constriction layer 16 includes a non-oxidized region 16a and an oxidized region 16b and constitutes a current constriction structure. The non-oxidized region 16a allows a current to pass, and the oxidized region 16b blocks the current. The non-oxidized region 16a is surrounded by the oxidized region 16b, and has a function of constricting the current flowing from the anode electrode 20 toward the cathode electrode 21. The current constriction layer 16 according to this exemplary embodiment is a P type.

The upper DBR 14 is a multilayer film reflector configured by alternately and repeatedly laminating two $0.25\lambda/n$-thick semiconductor layers having different refractive indices. The upper DBR 14 and the lower DBR 12 constitute a resonator that resonates and amplifies the light generated in the active layer 15.

The interlayer insulating film 13 is formed over the whole surface of the light emitting element 10 except for a region such as the anode electrode 20 where an opening is required to be formed, and has a function of protecting the light emitting element 10 from the outside air and the like.

The anode wiring 17 is connected to the anode electrode 20 and extended to the anode pad 18. The region where the anode wiring 17 is formed on the surface of the light emitting element is not particularly limited, but in this exemplary embodiment, the region is formed over the whole surface of the light emitting element 10 except for the emission opening 19. As shown in the parts <4> and <5> of FIG. 1, the emission opening 19 is formed in a circular shape by the ring-shaped anode electrode 20, a part of which is cut out.

By applying a positive electrode of a power source to the anode pad 18 and connecting a negative electrode to the cathode electrode 21, a current flows from the anode electrode 20 toward the cathode electrode 21. The current is constricted by the current constriction layer 16, and the resonator including the lower DBR 12, the active layer 15, and the upper DBR 14 is oscillated to emit emitted light Po from the emission opening 19. An emission surface protective film (not shown) is formed on the upper DBR 14 in the emission opening 19.

Figure 2:
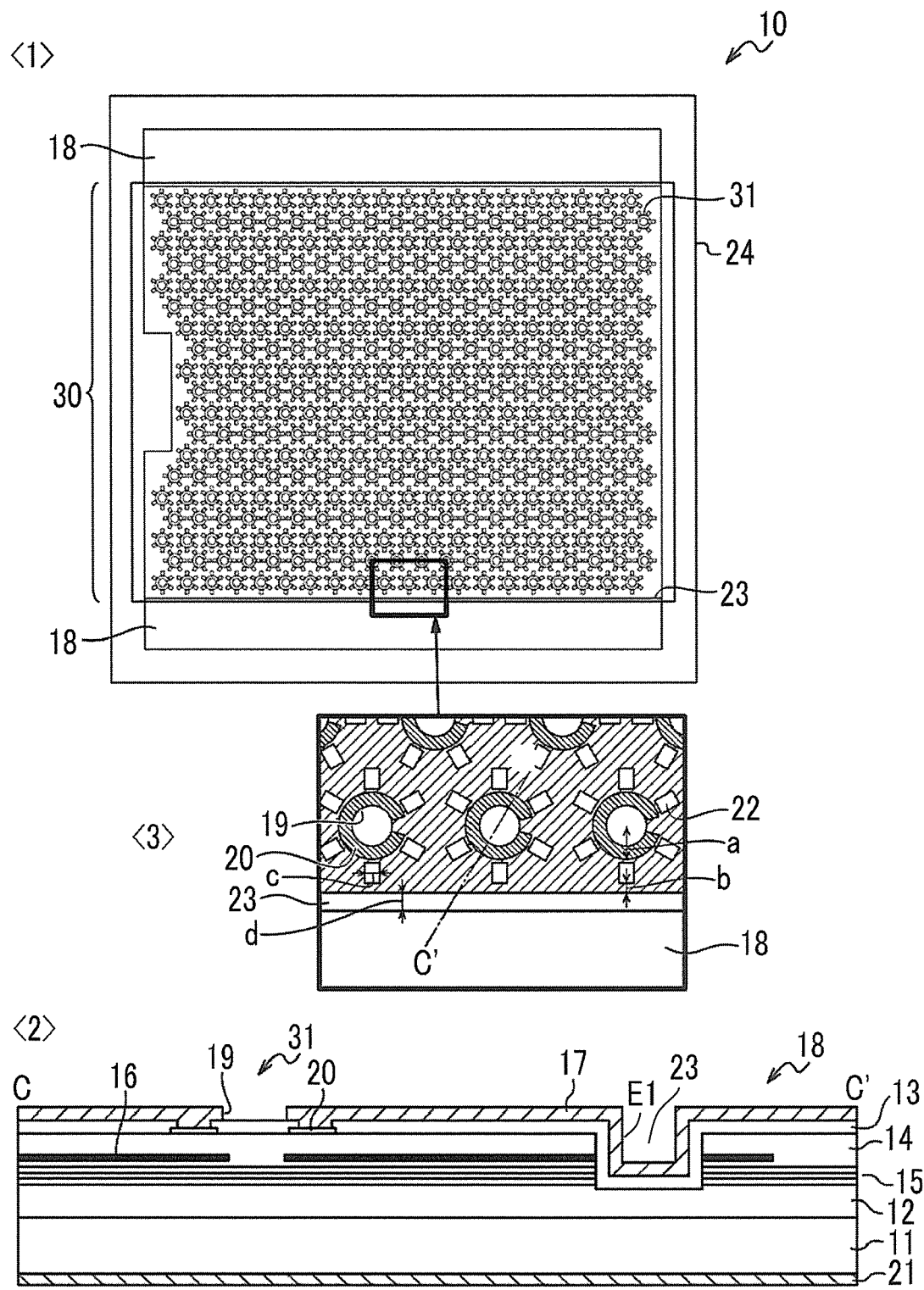
FIG. 2 shows a cross-sectional view taken along the straight line that does not pass through a trench of the light emitting element according to the first exemplary embodiment.

A cross-section of the light emitting element 10 cut along the straight line that does not pass through the trench 22 will be described with reference to FIG. 2. A part <2> of FIG. 2 shows a cross-section of the light emitting element 10 cut along the straight line C-C' that does not pass through the trenches 22 shown in a part <3> of FIG. 2. As shown in a part <2> of FIG. 2, it has been found that the current constriction layer 16 (oxidized region 16b) is extended to one end (hereinafter, "step portion E1") of the side wall of the recess portion 23 in a case where the light emitting element is cut along the straight line that does not pass through the trenches 22.

Here, the trench 22 is used in oxidizing a part of the upper DBR 14 in the formation of the current constriction layer 16, and may be called an oxidation aperture or the like. That is, the current constriction layer 16 is formed by undergoing an oxidation treatment in the manufacturing process of the light emitting element 10, and in the related art, the light emitting portion is formed in a mesa (post) shape in which the semiconductor layer is exposed to the region where the current constriction layer is formed, and the oxidation treatment is performed. In this exemplary embodiment, a method in which a plurality of trenches 22 exposed to the region where the current constriction layer is formed without exposure of the semiconductor layer around the whole circumference of the light emitting portion are partially formed around the light emitting portion, and the oxidation is performed is employed. In a method in which the oxidation is performed through a plurality of trenches, especially in a region other than the trenches, the semiconductor layer constituting the light emitting portion continues to the circumferential portion of the light emitting element 10, so that a leak current is generated unless the configuration is devised. The "trench 22" is an example of a "first recess portion" according to the exemplary embodiment of the present invention.

Figure 3:
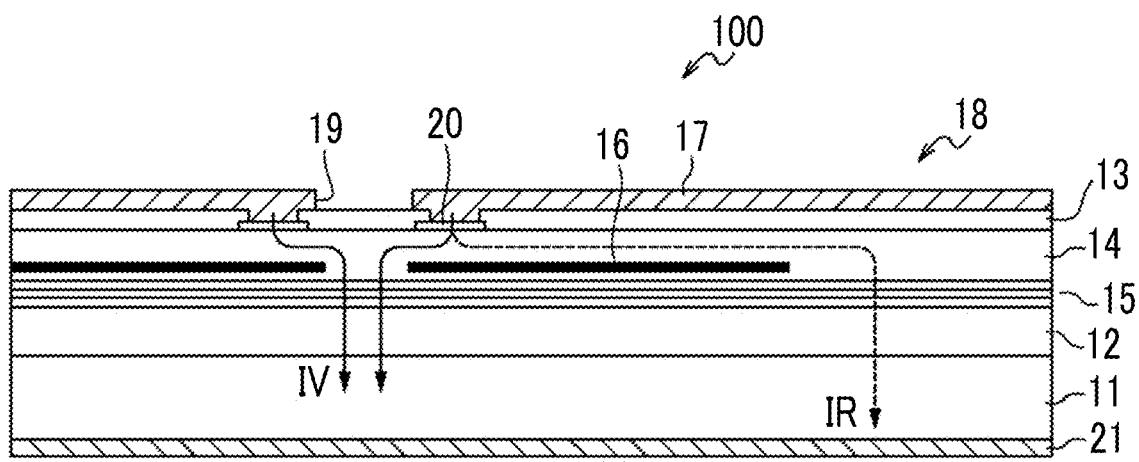
FIG. 3 is a view illustrating a leak current path in a light emitting element according to the related art.

A cause of the generation of the leak current will be described in greater detail with reference to FIG. 3. FIG. 3 shows a cross-sectional view of a light emitting element 100 according to a comparative example having no step portion E1, taken along the straight line that does not pass through the trench. The light emitting element 100 has the same basic configuration as the light emitting element 10, but in the light emitting element 100, a current constriction layer 16 on the side of an anode pad 18 does not reach an end portion of the light emitting element 100. This is due to the fact that the light emitting element 100 has a relatively large anode pad 18. That is, since the oxidation proceeds only from the trenches 22, the oxidation is not sufficiently performed to reach the end portion of the light emitting element 100.

Usually, a current IV for allowing the light emitting element 100 to emit light flows to pass through a non-oxidized region 16a of the current constriction layer 16 and reach a cathode electrode 21 as shown in FIG. 3. However, in a case where the current constriction layer 16 has a cut-out portion, a leak current IR flows to pass through an upper DBR 14, an active layer 15, and a lower DBR 12 and reach the cathode electrode 21 as shown in FIG. 3. Since the leak current IR is a useless current that does not contribute to the light emission of the light emitting element 100, it is required to prevent the leak current IR from being generated. That is, in the light emitting element 100, the entire current constriction layer 16 is required to be oxidized except for the non-oxidized region 16a.

In the light emitting element 100, the trenches 22 or additional openings may be appropriately positioned in order to oxidize the entire current constriction layer 16 except for the non-oxidized region 16a. However, in the light emitting element 100, the trenches 22 or additional openings may not be arranged. Examples of such a case include a case where a pad having a certain size is disposed. The pad is a portion to which a bonding wire or a solder ball for connecting the light emitting element 100 to an external substrate or the like is connected, and thus it is not preferable that an opening is provided although there is no particular limitation. FIG. 3 shows a cross-sectional view in a case where the pad is provided in, for example, a region having a certain width from an outer edge portion of the light emitting element 100. Thus, in order to secure a region of the pad having a certain size at a position along an outer edge portion 24 of the light emitting element 100, it is required to sufficiently consider the formation of the current constriction layer 16.

Accordingly, in this exemplary embodiment, the step portion E1 is provided so that it is possible to suppress the generation of a leak current even in a case where a pad is provided between an outer edge portion of a chip and a light emitting region in a light emitting element in which a current constriction layer is formed through a trench. Due to the step portion E1, since the light emitting region 30 can be separated from the anode pad 18, and the current constriction layer can be oxidized from the step portion E1 toward the light emitting region 30, the oxidized region 16b can be formed independently of the anode pad 18. Therefore, in the light emitting element in which the current constriction layer is formed through the trench, a pad having a required size is formed between the outer edge portion of the chip and the light emitting region.

The action of the step portion E1 will be described with reference to FIGS. 1 and 4. As shown in FIG. 1, the step portion E1 is formed by providing the recess portion 23 in the light emitting element 10. Accordingly, in the light emitting element 10, the oxidation from the side of the semiconductor layer exposed to the step portion E1 is also performed as well as the oxidation from the trenches 22 in the oxidation process.

Figure 4A:
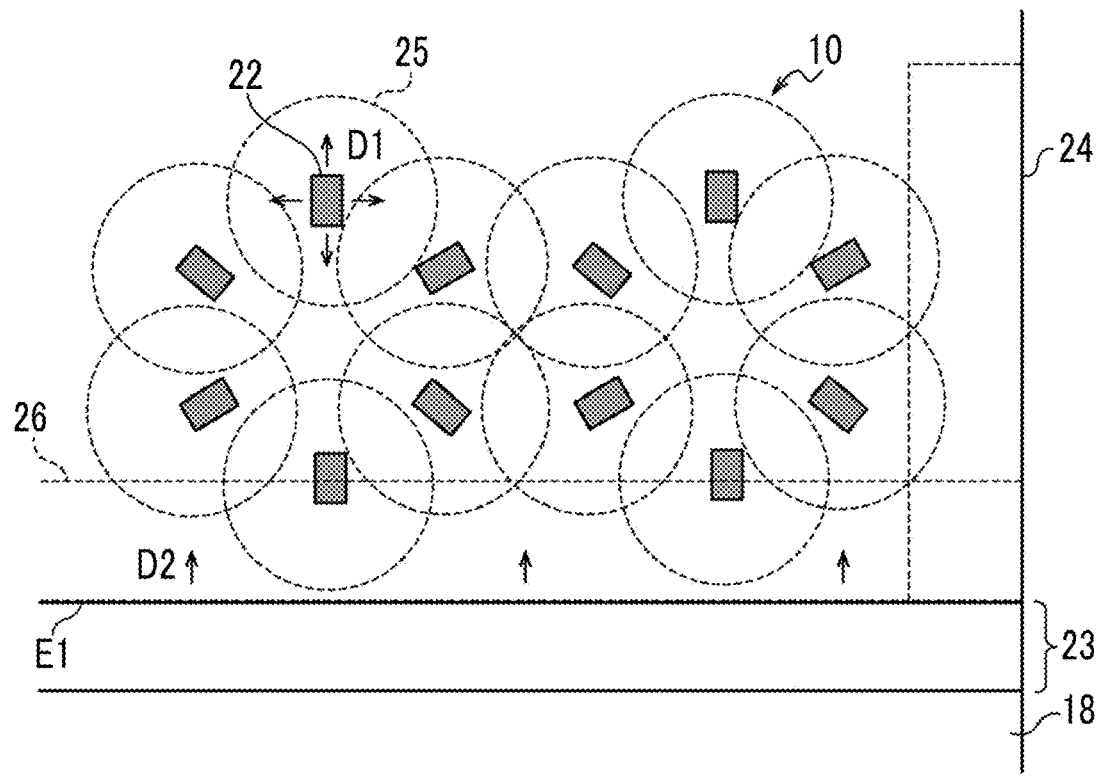
FIG. 4A is a plan view showing a case where a step portion of the light emitting element according to the first exemplary embodiment has a shape of a straight line.

FIG. 4A shows how the oxidation proceeds in the light emitting element 10. The oxidation from the trenches 22 isotropically spreads to the surroundings as shown by the direction D1 in FIG. 4A, and an oxidation front 25 thereof has a circular shape. As shown in the parts <4> and <5> of FIG. 1, in the light emitting element 10 according to this exemplary embodiment, six substantially rectangular trenches 22 are formed around the light emitting portion 31. Each trench 22 is formed at a depth sufficient to expose the position of the current constriction layer 16 as shown in the parts <2> and <3> of FIG. 1. By performing an oxidation treatment through each trench 22, a current constriction structure is formed in the current constriction layer 16. The shape of the non-oxidized region 16a in plan view is substantially hexagonal, reflecting the fact that the six trenches 22 are provided. The number of trenches 22 arranged around the light emitting portion 31 is not limited to six, and may be appropriately set in consideration of the shape of the current constriction layer 16 and the like.

The oxidation from the step portion E1 proceeds from one end of the recess portion 23 toward the trench 22 as shown by the direction D2 in FIG. 4A, and an oxidation front 26 thereof is linear. By the oxidation from the trench 22 and the step portion E1, the entire current constriction layer 16 is oxidized except for the non-oxidized region 16a in the light emitting element 10 according to this exemplary embodiment. That is, the oxidized region 16b is formed. In other words, the size and position of the trench 22 and the position and length of the step portion E1, and the like are determined so that the entire current constriction layer 16 other than the non-oxidized region 16a is the oxidized region 16b. As a result, the generation of a leak current IR is suppressed in the light emitting element 10. The current constriction layer 16 in the laminated region where the anode pad 18 is formed, which is shown in the part <2> of FIG. 1, is formed by the oxidation from the side of the recess portion 23. However, since the manufacturing process is performed in a wafer state in which a plurality of light emitting elements 10 are mounted on the surface, most light emitting elements 10 do not undergo the oxidation from the side of the outer edge portion 24.

Here, conditions for oxidation of the entire current constriction layer 16 included in the laminated region 32 positioned between the trench 22 and the recess portion 23 in the light emitting portion 31 will be examined. In the oxidation of the current constriction layer 16, it is required to oxidize the entire current constriction layer 16 included in the laminated region 32, and at the same time, to form the non-oxidized region 16a in the light emitting portion 31. As shown in the part <2> of FIG. 1, it is required to satisfy a relationship represented by (Expression 1) between a and b where a is a distance of the oxidized region 16b from a side wall of the trench 22 and b is a length of the current constriction layer 16 in the entire laminated region 32.

$$b < 2 \times a \qquad \text{(Expression 1)}$$

The oxidation of the current constriction layer 16 in the light emitting portion 31 proceeds from the sides of the both trenches 22. The oxidation in the laminated region 32 proceeds from the side of the trench 22 and from the side of the recess portion 23. In a case where the oxidation is performed for the same time, the oxidation front advances by the same distance. Accordingly, in a case where the width b of the laminated region 32 is not smaller than 2×a, a non-oxidized region is generated in the current constriction layer 16 in the laminated region 32. A condition for avoiding the above problem is the condition represented by (Expression 1). In a case where (Expression 1) is satisfied, it is ensured that the non-oxidized region 16a is formed in the light emitting portion 31 and the entire current constriction layer 16 included in the laminated region 32 is oxidized (is the oxidized region 16b). In the part <3> of FIG. 1, a' and b' are shown in place of a and b, respectively, but since a equals a' and b equals b', it is also required to satisfy (Expression 1).

Modification Example of First Exemplary Embodiment

Figure 4B:
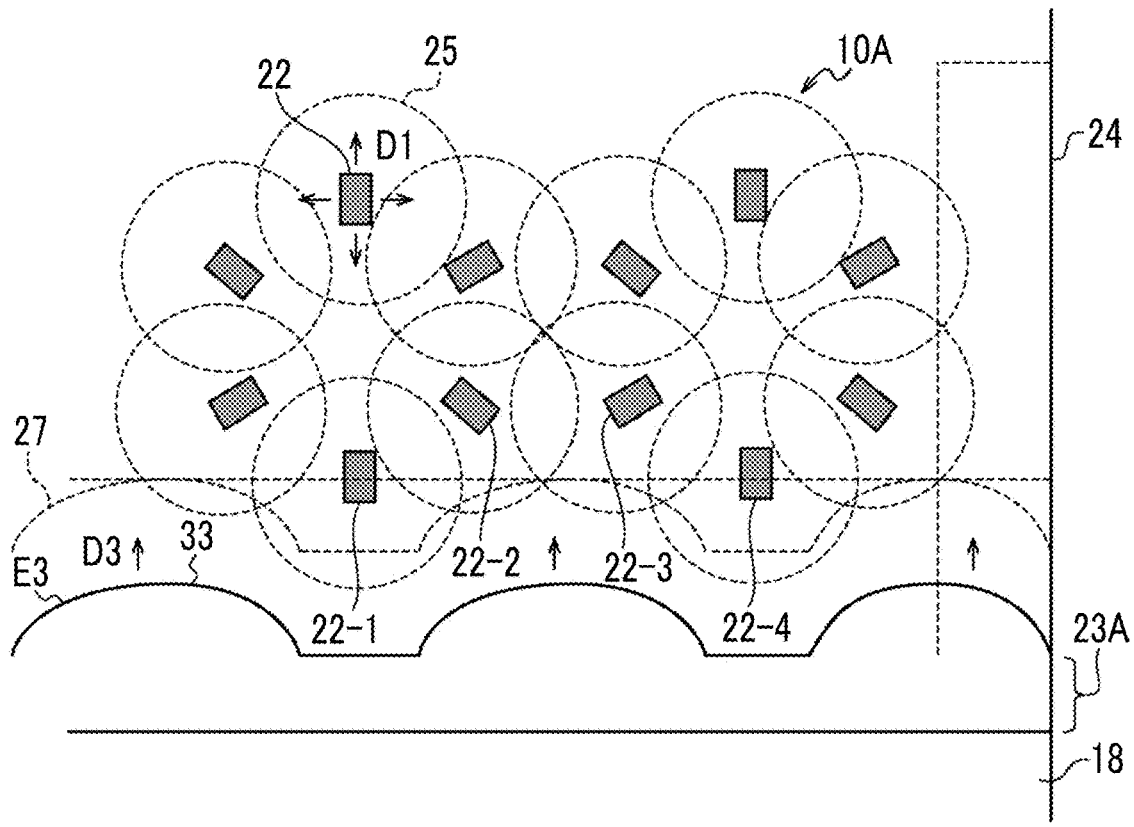
FIG. 4B is a plan view showing a case where the step portion has a shape including a curved line.

In the above-described exemplary embodiment, the form in which the step portion E1 has a shape of a straight line has been illustrated and described. However, the step portion is not limited to the straight line, and an appropriate shape may be adopted in consideration of the conditions for oxidation of the current constriction layer 16. For example, FIG. 4B shows a light emitting element 10A which employs a step portion E3 having an arc portion 33 and has a recess portion 23A. The arc portion 33 is provided to complement the oxidation in the vicinity of trenches 22-1, 22-2, 22-3, and 22-4. The oxidation from the step portion E3 proceeds in a direction of the direction D3, and an oxidation front 27 is formed. By the light emitting element 10A according to this modification example, the oxidation from the step portion E3 is performed in consideration with the oxidation from the trench 22 so that the entire current constriction layer 16 other than the non-oxidized region 16a in the light emitting element 10A is oxidized, and the generation of a leak current IR is suppressed. In this exemplary embodiment, the form having the arc portion 33 shown in FIG. 4B has been illustrated and described as the step portion E3. However, the present invention is not limited thereto, and an appropriate curved line may be provided in consideration of the arrangement of the trenches 22 and the like.

Figure 5:
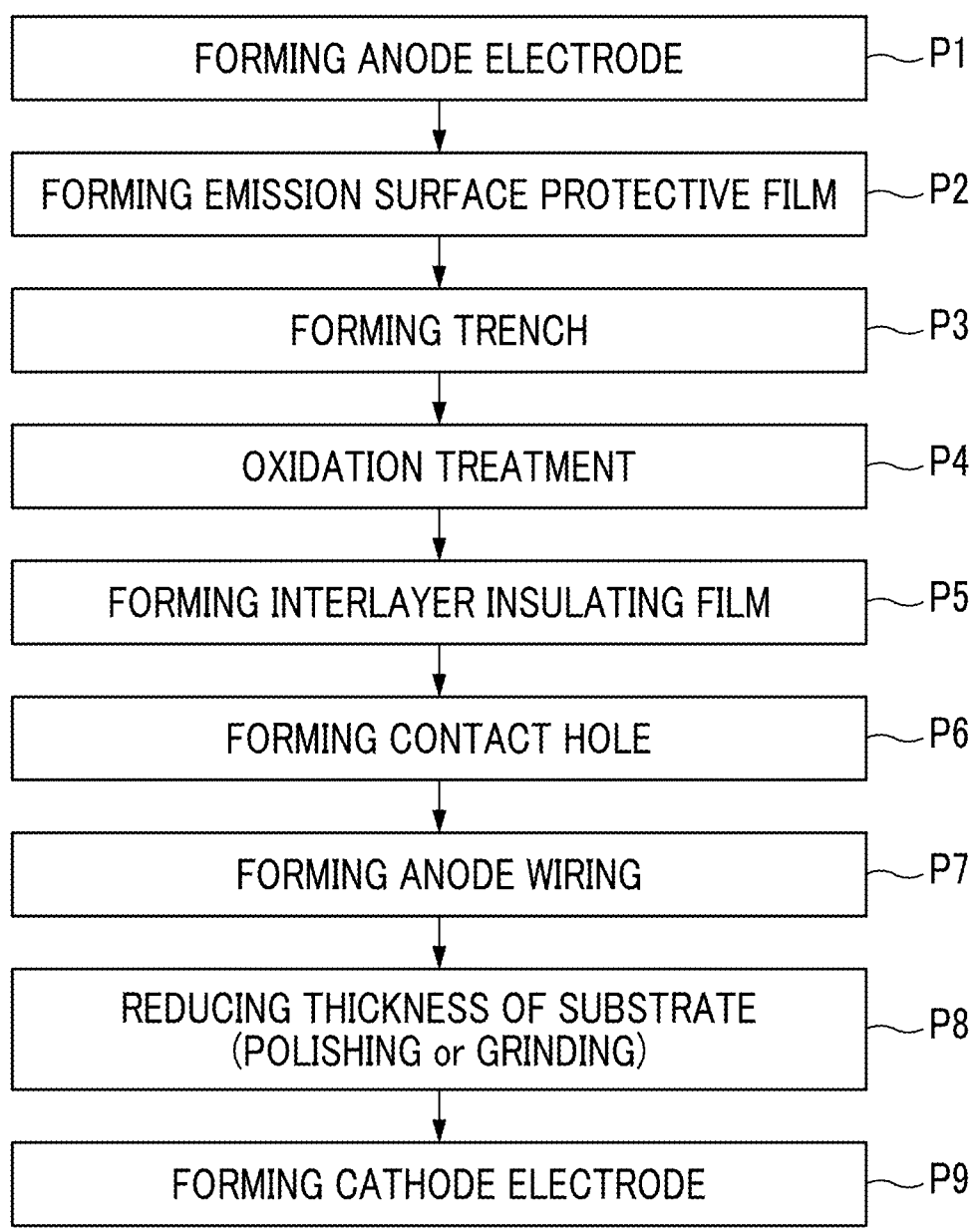
FIG. 5 is a process flow chart showing an example of a method of manufacturing the light emitting element according to the exemplary embodiment.

Next, the outline of a method of manufacturing the light emitting element 10 according to this exemplary embodiment will be described with reference to FIG. 5. The manufacturing process to be described below is performed in a wafer state in which a plurality of light emitting elements 10 are collectively formed, and epitaxial growth is completed as a pre-process. That is, the formation of layers up to the upper DBR 14 is completed.

In Process P1, the anode electrode 20 is formed.

An emission surface protective film is formed in Process P2.

In Process P3, the trenches 22 are formed by, for example, etching. In this exemplary embodiment, six trenches are formed around each light emitting portion 31. In this exemplary embodiment, the recess portion 23 is simultaneously formed by the etching process.

Here, it is preferable that a width c of the trench 22 shown in the part <4> of FIG. 1 and a width of the recess portion satisfy, for example, a relationship represented by (Expression 2), although there is no particular limitation.

$$c \leq d \quad \text{(Expression 2)}$$

The condition represented by (Expression 2) is a condition for ensuring that the etching of the recess portion 23 sufficiently proceeds. Etching conditions are determined so that the etching is performed until the current constriction layer 16 is sufficiently exposed in the light emitting portion 31. Accordingly, in a case where the width of the recess portion 23 is designed to be larger than the width of the trench 22, the etching of the recess portion 23 is performed up to a depth sufficient to expose the current constriction layer 16. This is based on the fact that the larger the width of the opening, the easier it is for the etching gas to reach the bottom of the opening, whereby the etching is performed deeper. That is, in a case where the width of the recess portion 23 is larger than the width of the trench 22, and the trench 22 is formed at a depth reaching the current constriction layer, the recess portion 23 also has a depth reaching the current constriction layer. Accordingly, the oxidation securely proceeds also from the recess portion 23.

An oxidation treatment is performed in Process P4. By this process, a current constriction structure (non-oxidized region 16a, oxidized region 16b) is formed in the current constriction layer 16. That is, in order to prevent the generation of a leak current described above, the entire current constriction layer 16 other than the non-oxidized region 16a included in the light emitting element 10 is oxidized to form the oxidized region 16b.

Next, in Process P5, an interlayer insulating film 13 is formed on the whole surface of the wafer except for the emission opening 19.

In Process P6, a contact hole (not shown) is formed in the portion corresponding to the anode electrode 20 in the interlayer insulating film 13.

In Process P7, an anode wiring extending from the anode electrode 20 to the anode pad 18 is formed.

In Process P8, the thickness of the substrate is reduced. That is, the back surface of the substrate 11 is polished or ground to adjust the thickness of the substrate 11 to a predetermined thickness.

In Process P9, a cathode electrode is formed on the back surface of the substrate 11.

With the above configuration, the light emitting element 10 according to this exemplary embodiment is manufactured.

Second Exemplary Embodiment

A light emitting element 10B according to this exemplary embodiment will be described with reference to FIG. 6. The light emitting element 10B has a form in which the recess portion 23 is removed in the light emitting element 10 according to the above-described exemplary embodiment, and the step portion E1 is replaced with a step portion E2. Accordingly, the configurations having the same functions as the configurations of the light emitting element 10 will be denoted by the same reference numerals, and detailed description thereof will be omitted.

Figure 6:
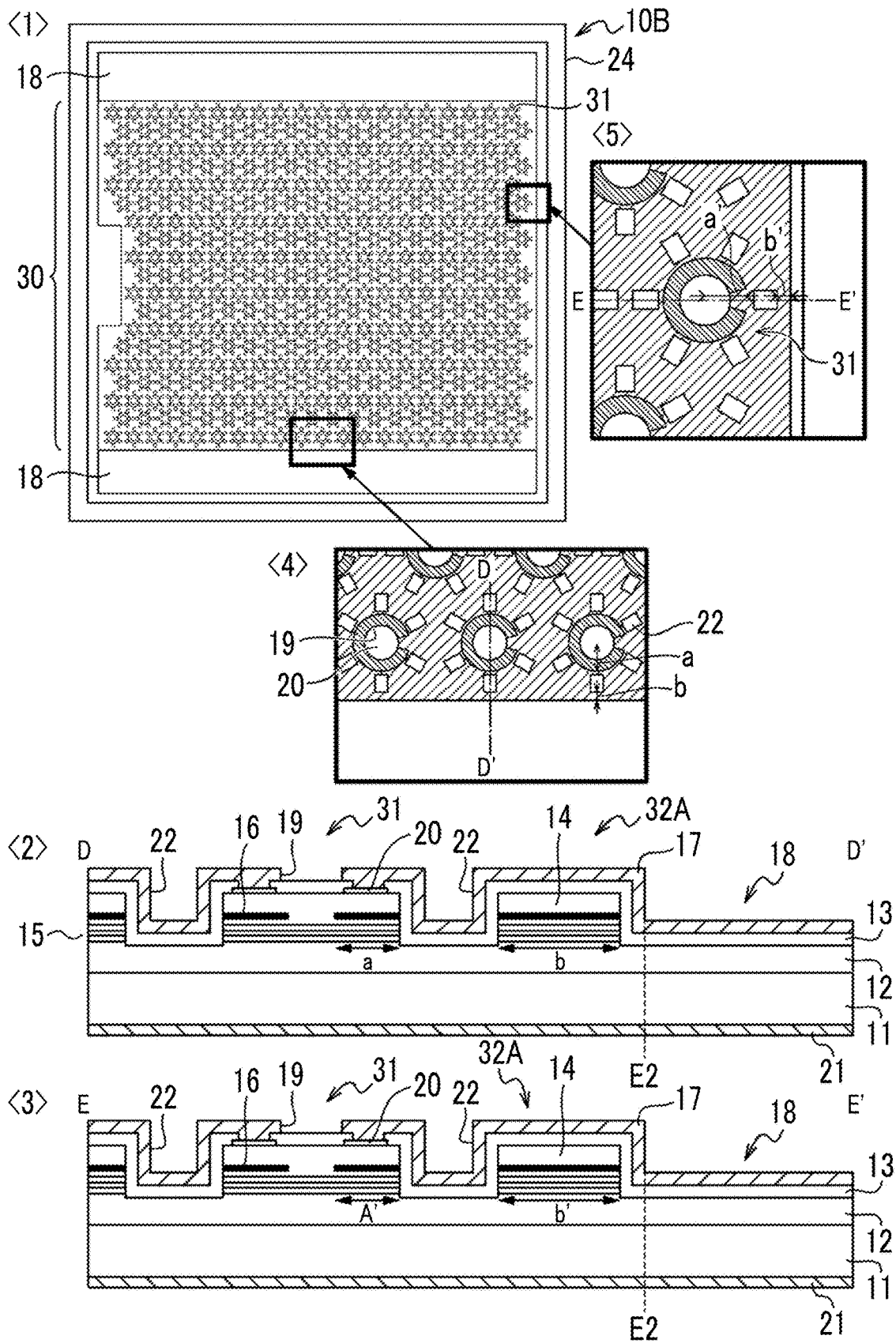
FIG. 6 shows plan views and cross-sectional views showing an example of a configuration of a light emitting element according to a second exemplary embodiment.

A part <1> of FIG. 6 shows a plan view of the light emitting element 10B, parts <2> and <3> show cross-sectional views, and parts <4> and <5> show partially enlarged views. A part <2> of FIG. 5 shows a cross-sectional view taken along the line D-D' shown in a part <4> of FIG. 5, and a part <3> of FIG. 5 shows a cross-sectional view taken along the line E-E' shown in a part <5> of FIG. 5.

As shown in the parts <2> and <3> of FIG. 6, the light emitting element 10B does not have the recess portion 23, an anode pad 18 is formed above a lower DBR 12 via an interlayer insulating film 13, and the step portion E2 is provided instead of the step portion E1. The shape of the step portion E2 in plan view may be a shape of a straight line as shown in FIG. 4A or be a shape including a curved line as shown in FIG. 4B. The step portion E2 acts in the same manner as the step portion E1. In the oxidation process, the oxidation proceeds from the step portion E2, and together with the oxidation from the trench 22, an entire current constriction layer 16 other than a non-oxidized region 16a included in the light emitting element 10B is oxidized to form an oxidized region 16b. As shown in the parts <2> and <3> of FIG. 6, an entire current constriction layer 16 included in the laminated region 32A positioned between the step portion E2 and the trench 22 is also an oxidized region 16b. Accordingly, by the light emitting element 10B according to this exemplary embodiment, the generation of a leak current is suppressed even in a case where a pad is provided between the outer edge portion of the chip and the light emitting region in the light emitting element in which the current constriction layer is formed through the trench.

In each exemplary embodiment, the form in which the cathode electrode 21 is provided on the back surface of the substrate 11 has been illustrated and described. However, the present invention is not limited thereto, and a form in which the cathode electrode 21 is provided on the front surface of the substrate 11 may also be adopted. In this case, an N type impurity (contact) region may be formed on the substrate 11 positioned below the lower DBR 12, and a cathode electrode may be formed on the N type impurity region.

In each exemplary embodiment, the form in which two anode pads 18 are provided along the two sides of the substrate 11 has been illustrated and described, but the present invention is not limited thereto. The anode pad may be provided along one side or along three or more sides.

In the above exemplary embodiments, the form in which an N type substrate is used has been illustrated and described. However, the present invention is not limited thereto, and a form in which a P type substrate is used may be adopted. In this case, the N type may be replaced with the P type, and the P type may be replaced with the N type in the above description.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element formed of a laminate having a current constriction layer, the element comprising:
   a semiconductor substrate;
   a light emitting portion having a plurality of first recess portions having a depth reaching the current constriction layer, and a current constriction structure formed in the current constriction layer and having an oxidized region where the current constriction layer is oxidized and a non-oxidized region surrounded by the oxidized region;
   an electrode pad disposed between the light emitting portion and an outer edge portion of the semiconductor substrate; and
   a step portion disposed between the electrode pad and the light emitting portion and formed from an upper surface of the laminate to the current constriction layer,
   wherein the current constriction layer in a region surrounded by the step portion is the oxidized region except for the non-oxidized region, wherein a distance a of the oxidized region from an end portion of the first recess portion in the light emitting portion and a width b of the laminate between the step portion and the first recess portion satisfy a relationship of b<2×a.

2. The light emitting element according to claim 1,
   wherein a second recess portion formed between the electrode pad and the light emitting portion is further provided, and
   the step portion is formed by a side wall of the second recess portion on the light emitting portion side.

3. The light emitting element according to claim 2,
   wherein a width of the first recess portion and a width of the second recess portion satisfy a relationship of width of first recess portion ≤width of second recess portion.

4. The light emitting element according to claim 1,
   wherein the step portion has a shape of a straight line in plan view.

5. The light emitting element according to claim 2,
   wherein the step portion has a shape of a straight line in plan view.

6. The light emitting element according to claim 3,
   wherein the step portion has a shape of a straight line in plan view.

7. The light emitting element according to claim 1,
   wherein the step portion has a shape including a straight line and a curved line in plan view.

8. The light emitting element according to claim 2,
   wherein the step portion has a shape including a straight line and a curved line in plan view.

9. The light emitting element according to claim 3,
   wherein the step portion has a shape including a straight line and a curved line in plan view.

10. The light emitting element according to claim 1,
    wherein the light emitting portion is configured as a surface emitting laser including a lower multilayer film reflector formed on the semiconductor substrate, an active layer, and an upper multilayer film reflector, and the electrode pad is formed above the lower multilayer film reflector via an insulating film.

11. The light emitting element according to claim 1,
    wherein the light emitting portion is configured as a surface emitting laser including a lower multilayer film reflector formed on the semiconductor substrate, an active layer, and an upper multilayer film reflector, and the electrode pad is formed above the upper multilayer film reflector via an insulating film.

12. The light emitting element according to claim 1,
    wherein a plurality of the light emitting portions are provided.

* * * * *